United States Patent
Happ et al.

(10) Patent No.: US 7,332,377 B2
(45) Date of Patent: Feb. 19, 2008

(54) MANUFACTURING METHOD WITH SELF-ALIGNED ARRANGEMENT OF SOLID BODY ELECTROLYTE MEMORY CELLS OF MINIMUM STRUCTURE SIZE

(75) Inventors: Thomas Happ, Tarrytown, NY (US); Ralf Symanczyk, Tuntenhausen (DE)

(73) Assignee: Infineon Technologies AG, Munich (DE)

( * ) Notice: Subject to any disclaimer, the term of this patent is extended or adjusted under 35 U.S.C. 154(b) by 245 days.

(21) Appl. No.: 11/285,387

(22) Filed: Nov. 23, 2005

(65) Prior Publication Data

US 2006/0141713 A1   Jun. 29, 2006

(30) Foreign Application Priority Data

Nov. 25, 2004   (DE) ............ 10 2004 056 973

(51) Int. Cl.
*H01L 21/82* (2006.01)
(52) U.S. Cl. ............. 438/129; 438/95; 438/466; 257/E21.645
(58) Field of Classification Search ........... 438/467; 257/E21.662, E21.656
See application file for complete search history.

(56) References Cited

U.S. PATENT DOCUMENTS

| | | |
|---|---|---|
| 6,348,365 B1 | 2/2002 | Moore |
| 6,984,548 B2 * | 1/2006 | Lung et al. ............ 438/131 |
| 2001/0055838 A1 * | 12/2001 | Walker et al. ........... 438/129 |
| 2003/0186481 A1 | 10/2003 | Lung |
| 2004/0087161 A1 | 5/2004 | Chang |

FOREIGN PATENT DOCUMENTS

WO   WO-2004/084229 A1   9/2004

* cited by examiner

*Primary Examiner*—Michael Lebentritt
*Assistant Examiner*—Cheung Lee
(74) *Attorney, Agent, or Firm*—Slater & Matsil, L.L.P.

(57) ABSTRACT

The object of providing a method for manufacturing solid body electrolyte memory cells or CB memory cells, respectively, which is suited for the simplified manufacturing of highly dense arrays with crosspoint architecture is solved by the present invention in that the solid body electrolyte memory cells are manufactured by self-aligned etching of the word lines that constitute simultaneously the top electrodes of the memory cells, and of the CB memory cells themselves. An advantage of the inventive method consists in that no via lithography is required, so that the manufacturing method is easier to perform, less expensive, and yields reliable results.

21 Claims, 4 Drawing Sheets

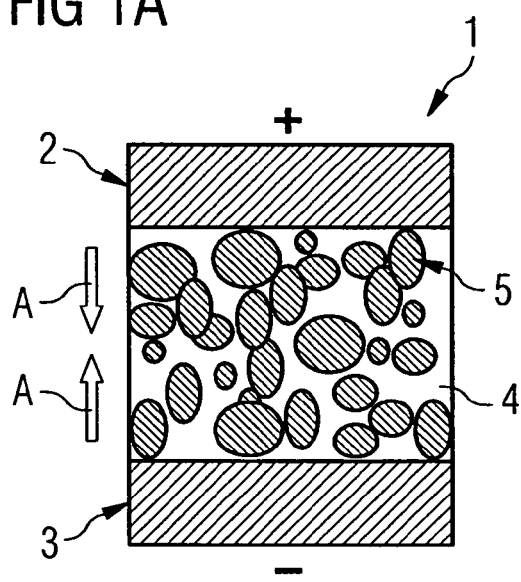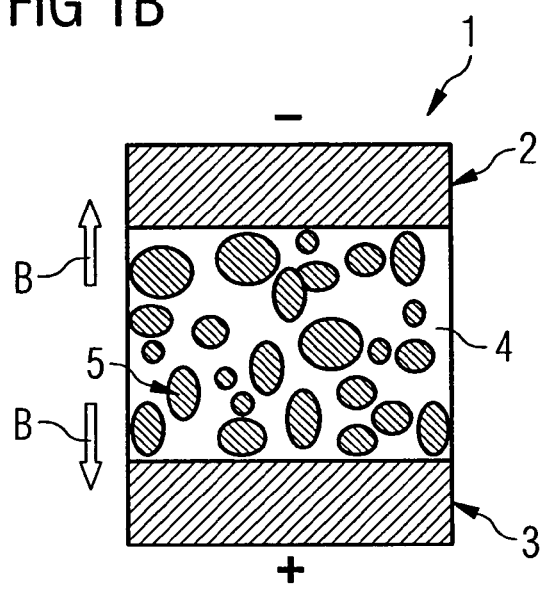

Figure 2A:
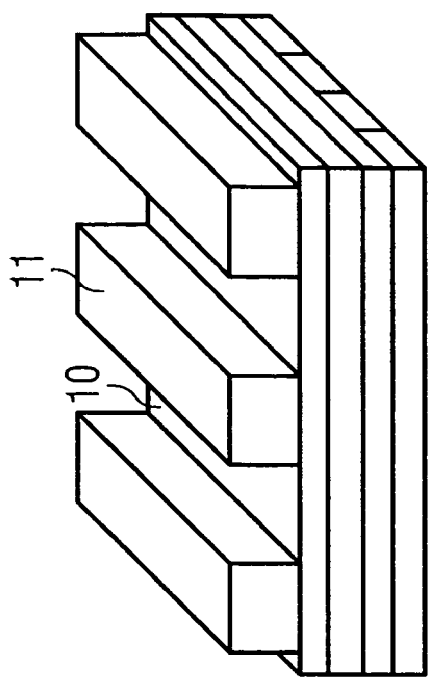

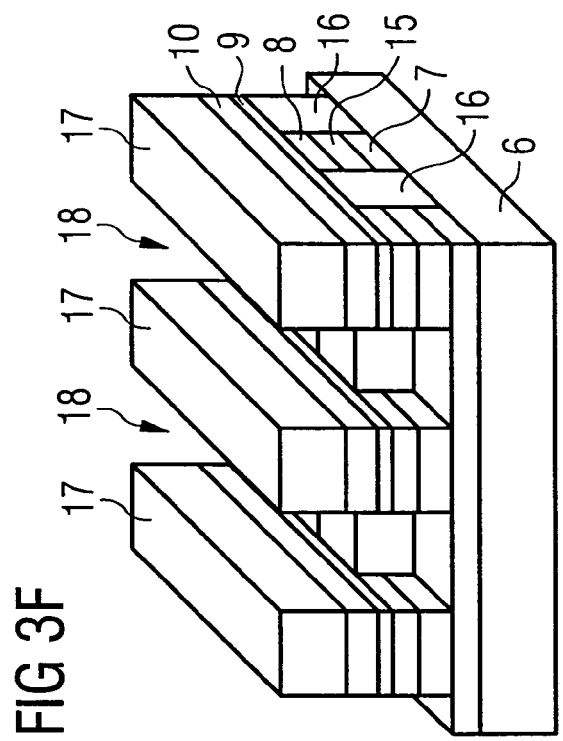
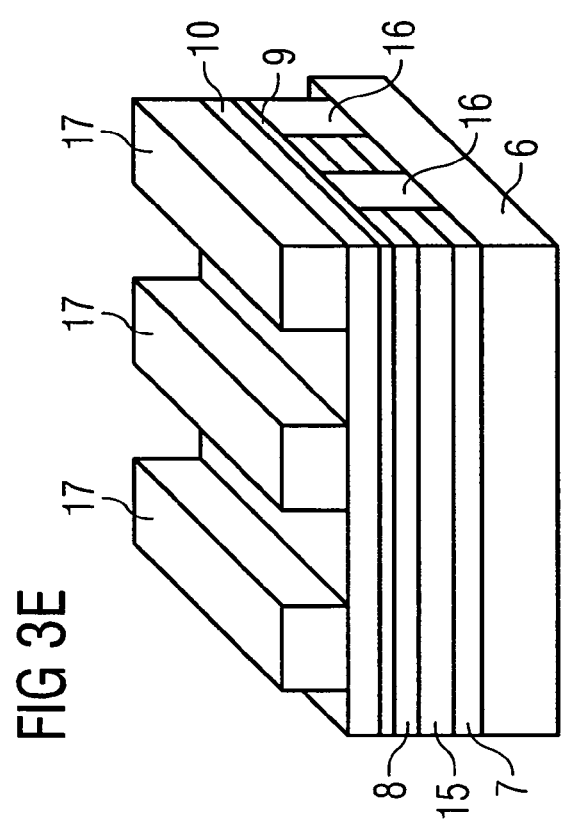
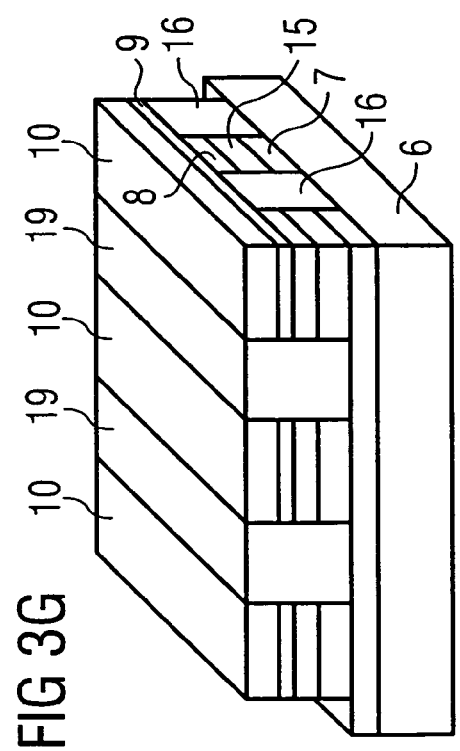

MANUFACTURING METHOD WITH SELF-ALIGNED ARRANGEMENT OF SOLID BODY ELECTROLYTE MEMORY CELLS OF MINIMUM STRUCTURE SIZE

CLAIM FOR PRIORITY

This application claims priority to German Application No. 10 2004 056 973.8, filed Nov. 25, 2004 in the German language, the contents of which are hereby incorporated by reference.

The invention relates to a method for manufacturing solid body electrolyte memory cells. The invention in particular relates to a manufacturing method with self-aligned arrangement of solid body electrolyte memory cells of minimum structure size.

An integrated memory device usually comprises a cell field (array) consisting of a plurality of memory cells and a matrix of electroconductive supply lines that is built up of column and row supply lines or word and bit lines, respectively. In this type of memory arrays with a so-called crosspoint architecture, the memory cells are each positioned at the crosspoints of the electroconductive supply lines that are each connected with the memory cell via an upper electrode or top electrode and a lower electrode or bottom electrode. To perform a change of the information content in a particular memory cell at the addressed crosspoint or to recall the memory cell content, the corresponding word and bit lines are selected and impacted either with a write current or with a read current.

Different kinds of semiconductor memories are known, e.g. a RAM (Random Access Memory). A RAM memory device is a memory with optional access, i.e. data can be stored under a particular address and can be read out again under this address later.

A particular kind of RAM semiconductor memories are DRAMs (Dynamic Random Access Memory) which comprise in general only one single, correspondingly controlled capacitive element per memory cell, e.g. a trench capacitor, with the capacitance of which one bit each can be stored as charge. DRAM memory cells are characterized by particularly short access times. In a DRAM memory cell, however, the charge or the information stored, respectively, remains for a relatively short time only, so that a so-called "refresh" must be performed regularly, wherein the corresponding information content is written in the memory cell again or is refreshed, respectively. The problem of leaking currents existing with the DRAM memory concept, which may result in a loss of charge or a loss of information, respectively, has so far been solved insufficiently only by the permanent refreshing of the stored charge.

In contrast to DRAMs, no "refresh" has to be performed in the case of SRAMs (Static Random Access Memory) since the data stored in the SRAM memory cell remain stored as long as an appropriate supply voltage is fed to the SRAM. Only in the case of non-volatile memory devices (NVMs), e.g. EPROMs, EEPROMs, and flash memories, do the stored data remain stored even when the supply voltage is switched off.

The presently common semiconductor memory technologies are primarily based on the principle of charge storage in materials produced by standard CMOS (complement metal oxide semiconductor) processes. The problem of leaking currents existing with the DRAM memory concept, which result in a loss of charge or a loss of information, respectively, has so far been solved insufficiently only by the permanent refreshing of the stored charge. The flash memory concept underlies the problem of write and read cycles that are limited by barrier layers, wherein no optimum solution has been found yet for the high switching voltages and the slow read and write cycles, either.

Since it is generally intended to accommodate as many memory cells as possible in a RAM memory device, one has been trying to realize them as simple as possible and on the smallest possible space, i.e. to scale them. The previously employed memory concepts (floating gate memories such as flash und DRAM) will, due to their functioning that is based on the storing of charges, presumably meet with physical scaling limits within foreseeable time. Furthermore, in the case of the flash memory concept, the high switching voltages and the limited number of read and write cycles, and in the case of the DRAM memory concept the limited duration of the storage of the charge state, constitute additional problems.

For solving the above-mentioned problems, so-called CB memory cells (CB=Conductive Bridging) have recently become known in prior art, in which it is possible to store digital information by a resistive switching process. A CB memory cell may be switched between different electric resistance values by bipolar electric pulsing. In a simple embodiment, such an element may be switched between a very high (e.g. in the GOhm range) and a distinctly lower resistance value (e.g. in the kOhm range) by applying short current or voltage pulses, wherein the switching rates may be less than a microsecond.

In the case of CB memory cells, a metal-doped electrochemically active material, e.g. a so-called chalcogenide material of germanium (Ge), selenium (Se), copper (Cu), sulphur (S), and/or silver (Ag), is present in a volume between an upper electrode or top electrode and a lower electrode or bottom electrode, for instance, in a GeSe, GeS, AgSe, or CuS compound. The above-mentioned switching process is, in the case of such CB memory cells, based on principle on the fact that, by applying appropriate current or voltage pulses of specific intensity and duration at the electrodes, metal-rich elements of so-called deposition clusters continue to increase in the chalcogenide material volume in the active chalcogenide material positioned between the electrodes until the two electrodes are finally bridged in an electroconductive manner, i.e. are electroconductively connected with each other, which corresponds to the electroconductive state of the CB memory cell.

By applying correspondingly inverse current or voltage pulses, this process may be reversed again, so that the corresponding CB memory cell can be returned to a highly resistive state. This way, a switching over between a state with a higher electroconductivity of the CB memory cell and a state with a lower electroconductivity of the CB memory cell is achieved.

The switching process in the CB memory cell is substantially based on the modulation of the chemical composition and the local nanostructure of the metal-doped chalcogenide material which serves as a solid body electrolyte and a diffusion matrix. The pure chalcogenide material typically has a semi-conductor behavior and has a very high electric resistance at room temperature, said electric resistance being by magnitudes, i.e. decimal powers of the ohmic resistance value, higher than that of an electroconductive metal. By the current or voltage pulses applied via the electrodes, the steric arrangement and the local concentration of the ionically and metallically present components of the mobile element in the diffusion matrix are modified. Due to that, the co-called bridging, i.e. an electric bridging of the volume between the electrodes of metal-rich depositions, may be caused, which modifies the electric resistance of the CB memory cell by several magnitudes in that the ohmic resistance value is reduced by several decimal powers in the above-described manner.

FIGS. 1A and 1B each show a schematic representation of the processes in a conductive bridging memory cell (CB memory cell) or solid body electrolyte memory cell 1, respectively, during switching over between particular memory states. As has already been explained above, solid body electrolyte memory cells 1 typically consist of a first electrode or anode 2, a second electrode or cathode 3, and a solid body ionic conductor or a volume 4 of an electrochemically active, metal-ion-doped chalcogenide material serving as an ionic conductor and positioned between the anode 2 and the cathode 3. As has been described above, the solid body electrolyte memory cells 1 are a resistively switching memory device, so that the total conductivity thereof can be assigned to a particular memory state, e.g. a logic One or a logic Zero. For detecting the respective memory state of the solid body electrolyte memory cell 1, the current flowing through the solid body electrolyte memory cell 1 is evaluated at an applied read voltage $U_{read}$.

In the case of a solid body electrolyte memory cell 1 it is possible to have metal ions diffuse in a controlled manner, by applying bipolar voltage pulses, through the generally poorly electroconductive ionic conductor into the volume 4 of electrochemically active chalcogenide material. These metal ions are, in the simplest case, identical with the material of which the anode 2 is manufactured. This means that metal anode material is oxidized during the ion diffusion and is, when a positive write voltage $U_{write} > U_{read}$ is applied, dissolved in the ionic conductor 4 or the volume 4, respectively, of electrochemically active chalcogenide material. The ion diffusion in the ionic conductor 4 of the solid body electrolyte memory cell 1 can be controlled by the duration, the amplitude and the polarity of the electric voltage applied externally to the electrodes 2, 3.

FIG. 1A shows the behavior of the solid body electrolyte memory cell 1 on applying of a positive electric voltage $U_{write}$ to the electrodes 2, 3. The metal cations diffuse under the influence of the externally generated electric field from the anode 2 through the ionic conductor 4 to the cathode 3. As soon as a sufficient number of metal ions have diffused from the anode 2 through the ionic conductor 4 in the direction of the cathode 3, a lowly resistive metal bridge can be formed between the anode 2 and the cathode 3, so that the electric resistance of the solid body electrolyte memory cell 1 decreases strongly. In so doing, metal-enriched, e.g. silver (Ag)-enriched or copper (Cu)-enriched, deposition clusters 5 are generated in the chalcogenide material volume 4, said deposition clusters 5 continuing to increase and to concentrate in the direction of the Arrows A until the two electrodes 2, 3 are finally electroconductively connected with each other, which corresponds to the electroconductive state of the CB memory cell 1.

FIG. 1B illustrates how this process can be reversed again by applying correspondingly inverse current or voltage pulses, so that the CB memory cell or solid body electrolyte memory cell 1, respectively, can be returned to a highly resistive or non-conductive state, respectively. The metal-rich deposition clusters 5 dissolve again-at least partially in the chalcogenide material volume 4 between the electrodes 2, 3, or drift apart in the direction of the Arrows B, respectively, so that the metal bridge between the anode 2 and the cathode 3 is interrupted. This way, a switching over from the state with a higher electroconductivity of the solid body electrolyte memory cell 1 and a state with a lower electroconductivity of the solid body electrolyte memory cell 1 is achieved.

For manufacturing a solid body electrolyte memory cell, materials such as $Ge_xSe_{1-x}$, $GexS_{1-x}$, $WO_x$, Cu—S, Cu—Se, or similar chalcogenide-containing compounds are generally used for the ionic conductor. As reactive materials for the metal electrodes, Cu or, in particular, Ag are typically used. So far there have only been known results from the manufacturing of individual memory cells in vertical or coplanar geometry, which are, however, less suited for highly dense memories. The general object of the present invention is therefore to provide a solid body electrolyte memory cell or CB memory cell, respectively, which is suited for competitive, commercial applications. To this end, CB memory cells have to be manufactured in an array with an integration or scaling, respectively, that is as dense as possible, using a technology that is as simple as possible and that yields reliable results.

So far, individual CB memory cells with vertical geometry or vertical cells, respectively, have been manufactured by means of so-called active-over-via or active-in-via structures. In so doing, the electrochemically active chalcogenide material, i.e. the solid body electrolyte and the reactive metal, is deposited in or over previously etched via openings. This technology, however, requires a sophisticated via lithography and an exact checking of the filling properties and the stoichiometry of the ionic conductor material in the via. Furthermore, the applicable deposition techniques are strongly restricted by that.

In addition, by the use of the known active-over-via or active-in-via structures, the cell size of the memory cell increases significantly since the vias are in their minimum structure size always larger than the equivalent minimum line dimensions. In the case of a 140 nm technology, the minimum via diameter is, for instance, 180 nm, or 120 nm in the case of a 90 nm technology. Additionally, safety rate actions for alignment tolerances during lithography have to be observed. The result of this is that, when using the active-in-via method, a memory cell with crosspoint architecture is only possible with a structure size of $F^2$ larger than 8, with F designating the minimum lithographically definable structure dimension.

It is therefore an object of the present invention to provide a method for integrating or manufacturing, respectively, solid body electrolyte memory cells or CB memory cells, respectively, which is characterized by a high scalability of the CB memory cells. Another object of the present invention consists in providing a method for manufacturing solid body electrolyte memory cells or CB memory cells, respectively, with high integration or high density, respectively, which is suited for the simplified manufacturing of highly dense arrays with crosspoint architecture.

In accordance with the present invention, this object is solved by a method with the features indicated in claim 1. Advantageous embodiments of the invention are defined in the subclaims.

In accordance with the present invention, the object is solved by a method for manufacturing or integrating, respectively, solid body electrolyte memory cells for generating at least one memory array with crosspoint architecture without an additional selection device serving the addressing of individual memory cells, said method comprising at least the following steps:

depositing a bottom electrode material on a silicon substrate, structuring the bottom electrode material for forming bottom electrode paths, generating a layer stack on the prestructured bottom electrode paths by the depositing of layers
of a solid body electrolyte material,
of a reactive metal, and
of a top electrode material, structuring the top electrode material lithographically vertically to the bottom electrode paths by self-aligned etching of the top electrode material for generating top electrode paths, and structuring the remaining layer stack lithographically vertically to the bottom electrode paths by self-aligned etching of the active layers or of the solid body electrolyte material, respectively, and of the reactive metal for generating continuous paths in the layer stack.

The method according to a first preferred embodiment of the invention serves the manufacturing of a crosspoint array of solid body electrolyte memory cells without an additional selection device. In so doing,
a solid body electrolyte,
a reactive metal, and
a top electrode material are each deposited planarly on the prestructured bottom electrode paths or on the bit lines of a memory array, respectively. Subsequently, the layer stack is structured lithographically vertically to the bottom electrode paths, and both the top electrode or the word line, respectively, of the memory array and the active layers are etched in the form of continuous paths.

The principle underlying the present invention consists in manufacturing solid body electrolyte memory cells by the self-aligned etching of the word lines that constitute simultaneously the top electrode of the memory cells, and of the memory cells themselves. This method is distinctly simpler and results in smaller cell dimensions than known active-over-via or active-in-via methods.

In accordance with a preferred embodiment of the inventive manufacturing method, the etching of the top electrode (word line) and of the active layers may be performed in one step by using suitable etching agents. Alternatively, the etching may be performed in two steps in that firstly a top electrode or the word line, respectively, and subsequently the active layers are generated by using different etching agents, wherein, in the second step, the word line may again serve as self-aligned mask for the top electrode or the active layers, respectively.

In accordance with the present invention, the above-mentioned objects are also solved by a second embodiment of the inventive method for manufacturing or integrating, respectively, solid body electrolyte memory cells for generating at least one memory array with crosspoint architecture and with integrated diodes for the specific addressing of individual memory cells, wherein the method comprises at least the following steps:

generating a bottom part of a layer stack on a silicon substrate by the deposition of layers
of a bottom electrode material,
of a selection diode material, and
of a solid body electrolyte material, structuring or etching, respectively, the generated bottom part of the layer stack for forming bottom electrode paths, filling the generated structures with insulating material and subsequent planarizing, generating a top part of the layer stack by the deposition of layers
of an ion donor material, and
of a top electrode material, structuring or etching, respectively, the ion donor material and the top electrode material in line shape vertically to the bottom electrode paths.

This second embodiment of the inventive method is particularly suited for the manufacturing of solid body electrolyte memory cells or CB memory cells, respectively, which are arranged in highly dense memory arrays with crosspoint architecture and are equipped with integrated diodes which serve to specifically address individual memory cells and to reduce the leaking currents in the memory array.

In this second inventive method, a layer stack with
a bottom electrode,
a selection diode, e.g. of doped polysilicon,
a solid body electrolyte,
and possibly an ion donor is first of all deposited planarly, structured in bit lines, filled with insulating material, and planarized. Subsequently, the ion donor (if this has not yet been done) and the top electrode are deposited planarly, structure in line shape vertically to the bottom electrode, and etched down to the bottom electrode. Thus there result small towers of a solid body electrolyte memory cell and of the pertinent diode structure in minimum structure size.

In accordance with a further aspect of the present invention, the second method may also be applied to crosspoint arrays without selection diodes. This application has the advantage that, due to the negligible electric (cross) conductivity of the undoped solid body electrolyte, a complete geometric separation of the individual CB memory cells is not necessary.

In accordance with the present invention there are provided two methods for integrating or manufacturing, respectively, solid body electrolyte memory cells or CB memory cells, respectively, which are suited for the simplified manufacturing of highly dense arrays with crosspoint architecture. Both methods are based on principle on a self-aligned etching of the top electrode and of the CB memory cell itself. An advantage of the inventive method consists in that no via lithography is required, so that the manufacturing method is easier to perform, is less expensive, and yields reliable results.

The inventive methods are characterized by the following advantages vis-a-vis the known active-over-via or active-in-via methods:

1. In the inventive methods, exclusively planar depositions are needed for the electrochemically active chalcogenide materials (GeSe, GeS, Ag, . . . ). The performing of planar depositions is particularly important if no deposition processes with sufficiently good via filling properties and exact stoichiometry check are available for these chalcogenide materials, or can be developed with great effort only.

2. With the inventive methods, distinctly smaller cell sizes can be realized since only critical line structures are required. This way, cell sizes of $4F^2$ (F=feature size) can be realized with the inventive methods.

3. The inventive methods have less process complexity than comparable known strategies or methods for manufacturing vias, their fillings, and their contacting.

In the following, the invention will be described by means of preferred embodiments with reference to the enclosed drawing. The drawing shows:

FIGS. 1A and 1B schematic representations of the processes in a conductive bridging memory cell (CB memory cell) or solid body electrolyte memory cell, respectively, during the switching over between particular memory states that have already been described above;

FIGS. 2A to 2D schematic representations of individual process steps of the method according to a first preferred embodiment of the present invention; and FIGS. 3A to 3G schematic representations of individual process steps of the method according to a second preferred embodiment of the present invention.

FIGS. 2A to 2D show schematic representations of the method with the individual process steps according to a first preferred embodiment of the present invention. This is a method for manufacturing or integrating, respectively, solid body electrolyte memory cells for generating highly dense memory arrays with crosspoint architecture without an additional selection device serving to address individual memory cells.

First of all, a layer stack is generated which comprises a number of different material layers, as may be seen in FIG. 2A. The lowermost layer consists of a silicon substrate 6 that has been preprocessed in a suitable manner. In this first preferred embodiment of the inventive method, a bottom electrode material 7 for the solid body electrolyte memory cell is first of all deposited on the silicon substrate 6 and is prestructured in the form of electric electrode paths 7 and inserted in a dielectric, e.g. $SiO_2$. These electric electrode paths 7 are later used as bit lines of the memory array.

A layer stack of a solid body electrolyte or ionic conductor material 8, respectively, e.g. of a GeSe compound, a reactive metal 9 such as silver or copper, and a top electrode material 10, e.g. aluminum, are successively and each planarly deposited one upon the other on the bottom electrode material 7. The top electrode material 10 is later structured to word lines of the memory array. A photo resist layer 11 that serves for the lithographic definition of the subsequent etching process is applied on the layer stack as uppermost layer, as is shown in FIG. 2A.

Figure 2B:
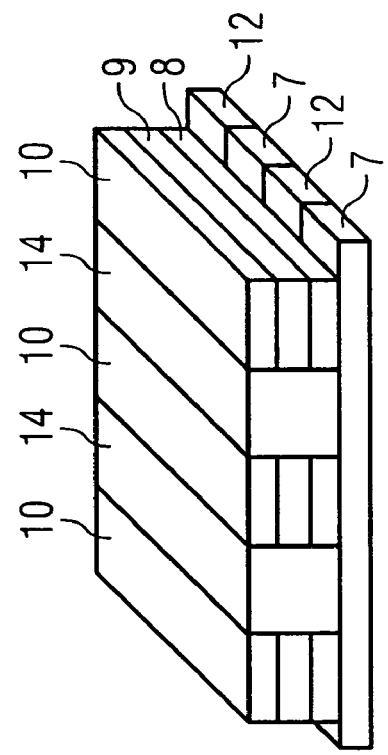
Figure 2C:
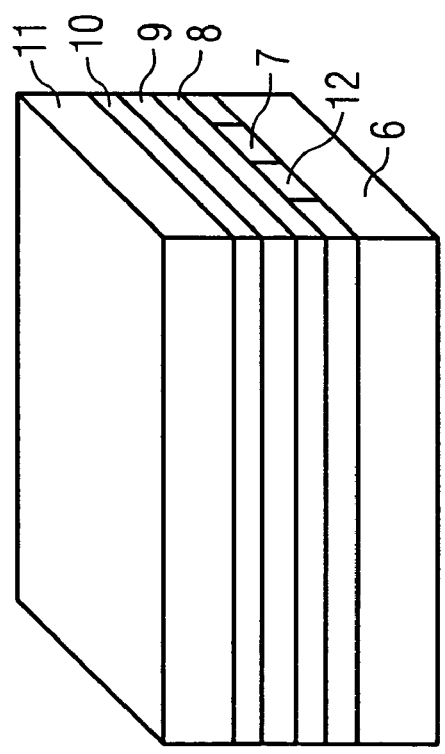

FIG. 2B shows how a line array that serves for the lithographic definition of electric electrode lines in the top electrode material layer 10 which are oriented orthogonally to the bottom electrode paths 7 and later constitute the word lines of the memory array is formed by means of appropriate treatment of the photo resist layer 11. As is illustrated in FIG. 2C, the generated layer stack is, to this end, treated with a suitable anisotropic etching method, e.g. RIE (Reactive Ion Etching), an etching method by means of reactive ions. In so doing, the layer stack is etched down to the bottom electrode paths 7, so that corresponding trenches are produced in the above-mentioned line array.

This etching may also be performed in two successive etching steps in that firstly the top electrode 10 and subsequently the remaining layer stack is etched down to the bottom electrode paths 7, wherein the layer of the top electrode material 10 with the electrode paths 10 defined therein serves as self-aligned mask.

Figure 2D:
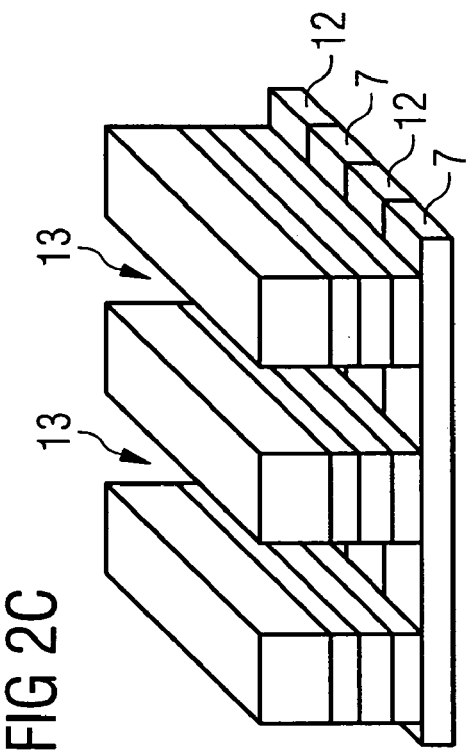

FIG. 2D shows how the etched trenches are then filled with a suitable dielectric 14, e.g. SiO2, and are planarized, wherein the photo resist layer 11 is removed, so that the top electrode layer with the word lines 10 defined therein constitutes the uppermost layer of the remaining layer stack or of the generated solid body electrolyte memory cell, respectively.

FIGS. 3A to 3G show schematic representations of the method with the individual process steps according to a second preferred embodiment of the present invention. This is a method for manufacturing or integrating, respectively, solid body electrolyte memory cells for generating highly dense memory arrays with crosspoint architecture, wherein the solid body electrolyte memory cells are provided with an additional selection device in the form of a diode for addressing individual memory cells.

Figure 3A:
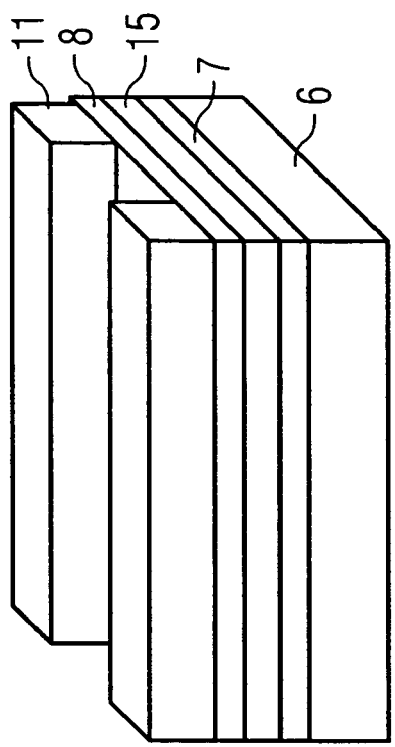

As is illustrated in FIG. 3A, a layer stack is first of all constructed by successive planar depositions on a silicon substrate 6 that has been preprocessed in a suitable manner. The layer stack consists of a bottom electrode 7, a suitable diode structure 15 such as a poly-pn diode, a poly-n-Si in combination with p-GeSe, or a Schottky diode, etc., and a solid body electrolyte or ionic conductor material 8, respectively. In the process illustrated in FIGS. 3A to 3G, the reactive metal 9 and the top electrode material 10 are deposited on the layer stack later only (FIG. 3E).

For process-technological reasons it may, however, be more beneficial to also deposit the reactive electrode material 9, e.g. Ag, prior to the structuring or etching, respectively, of the layer stack. This enables, on the one hand, exacter checking of the stoichiometry irrespective of end point checks after the above-mentioned CMP process and, on the other hand, also variations of the layer thicknesses. As uppermost layer—like in the first embodiment of the inventive method illustrated in FIGS. 2A to 2D—a photo resist layer 11 is applied on the layer stack, said photo resist layer 11 serving the lithographic definition of the subsequent etching process.

Figure 3B:
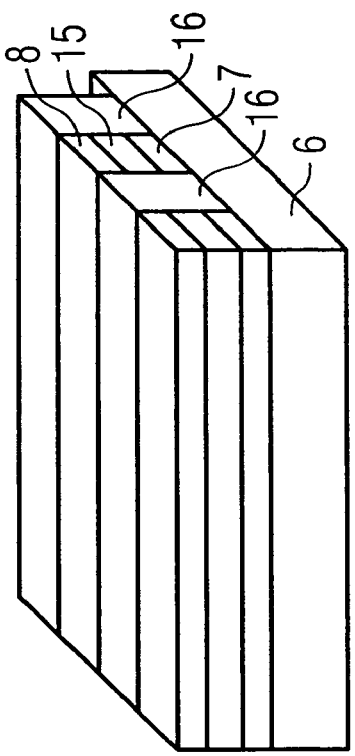
Figure 3C:
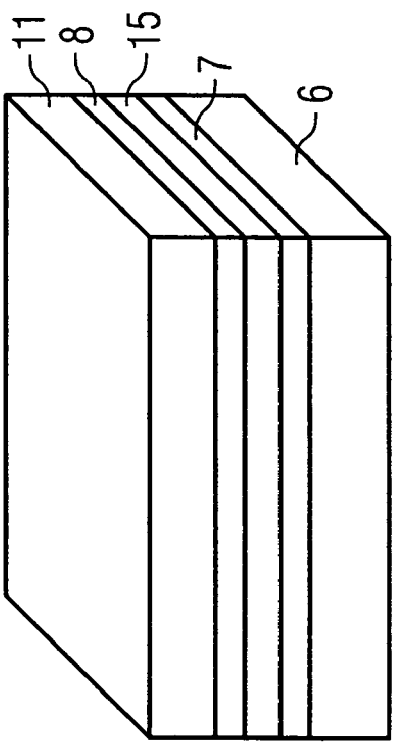

As is illustrated in FIG. 3B, after the depositing of the layer stack, bit lines in the form of a line array are structured on the photo resist layer 11 in a lithographic process. Subsequently, as is illustrated in FIG. 3C, the entire layer stack is etched through down to the bit lines 7 in the bottom electrode material layer, with corresponding trenches 13 being produced in the line array.

Figure 3D:
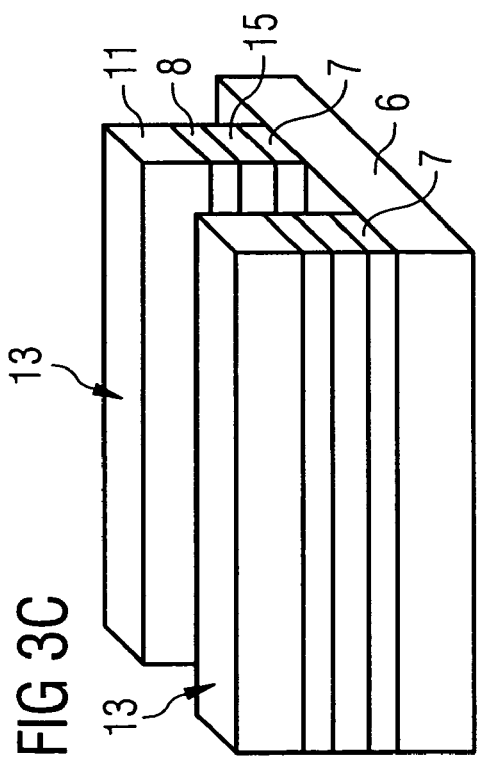

As is illustrated in FIG. 3D, the resulting trenches 13 are filled with a suitable dielectric 16 such as $SiO_2$, and are planarized, for instance, in a CMP process. FIG. 3E shows that subsequently, in a process for metal deposition (if this has not yet happened) the reactive metal 9 and the material for metallization of the top electrode 10 are deposited planarly. In a subsequent lithographic process, the reactive metal 9 and the metallization for the top electrode 10 are structured orthogonally to the bottom electrode paths or bit lines 7, respectively, by means of a further photo resist layer 17.

As is illustrated in FIG. 3F, in a subsequent etching process both the top electrode layer 10 and the layer stack including the layers with the solid body electrolyte material 8 and the diode material(s) 15 are structured in correspondence with the line shape on the photo resist layer 17 in that the layer stack is etched down to the bottom electrode paths or bit lines 7, respectively. The etching is, however, not performed through the bottom electrodes or bit lines 7, respectively, which can be achieved by a suitably chosen layer thickness for the bottom electrode layer 7 and by corresponding selectivity of the etching process used at that point in time or at the etching progress, respectively.

Etching may either be performed, as is illustrated in FIGS. 3A to 3G, selectively to the insulating material 16, with holes 18 being produced, or else non-selectively, with trenches being produced. As is illustrated in FIG. 3G, after the removal of the photo resist layer 17, the etched holes 18 (in the case of selective etching) or the etched trenches (in the case of non-selective etching) are finally filled with insulating material 19 and are planarized, for instance, in a CMP process, so that the top electrode layer with the word lines 10 defined therein constitutes the uppermost layer of the remaining layer stack or of the generated solid body electrolyte memory cell, respectively.

What is claimed is:

1. A method for manufacturing or integrating, respectively, solid body electrolyte memory cells for generating at least one memory array with crosspoint architecture, said method comprising at least the following steps:
   depositing a bottom electrode material on a silicon substrate,
   structuring the bottom electrode material for forming bottom electrode paths,
   generating a layer stack on the prestructured bottom electrode paths by depositing of layers
      of a solid body electrolyte material,
      of a reactive metal, and
      of a top electrode material,
   structuring the top electrode material lithographically vertically to the bottom electrode paths by self-aligned etching of the top electrode material for generating top electrode paths, and
   structuring the remaining layer stack lithographically vertically to the bottom electrode paths by self-aligned etching of active layers or of the solid body electrolyte material, respectively, and of the reactive metal for generating continuous paths or trenches, respectively, in the layer stack.

2. The method according to claim 1, wherein said top electrode paths serve as a self-aligned mask for etching during the etching of said active layers or of said solid body electrolyte material, respectively, and said reactive metal.

3. The method according to claim 1, wherein the etching of said top electrode material and the self-aligned etching of said active layers or of said solid body electrolyte material, respectively, and of said reactive metal is performed in one common step by using suitable etching agents.

4. The method according to claim 1, wherein the etching of said top electrode material and the self-aligned etching of said active layers or of said solid body electrolyte material, respectively, and of said reactive metal is performed in separate steps by using different etching agents.

5. The method according to claim 1, wherein firstly the etching of said top electrode material and subsequently the self-aligned etching of said active layers or of said solid body electrolyte material, respectively, is performed.

6. The method according to claim 1, wherein depositing of said top electrode material, of said bottom electrode material, of said solid body electrolyte material, and/or of said reactive metal is performed by planar deposition.

7. A method for manufacturing or integrating, respectively, solid body electrolyte memory cells for generating at least one memory array with crosspoint architecture and with integrated diodes for the specific addressing of individual memory cells, wherein the method comprises at least the following steps:
   generating a bottom part of a layer stack on a silicon substrate by deposition of layers
      of a bottom electrode material,
      of a selection diode material, and
      of a solid body electrolyte material,
   structuring or etching, respectively, the generated bottom part of the layer stack for forming bottom electrode paths,
   filling the generated structures with insulating material, and subsequent planarizing,
   generating a top part of the layer stack by deposition of layers
      of an ion donor material, and
      of a top electrode material,
   structuring or etching, respectively, the ion donor material and the top electrode material in line shape vertically to the bottom electrode paths.

8. The method according to claim 7, wherein the deposition of said ion donor material is performed additionally or alternatively prior to the structuring or etching, respectively, of the bottom part of the layer stack.

9. The method according to claim 8, wherein doped polysilicon is deposited as selection diode material.

10. The method according to claim 7, wherein tower-like structures of one respective solid body electrolyte memory cell and the pertinent diode structure are formed in minimum structure size by structuring or etching, respectively, of the layer stack.

11. The method according to claim 7, wherein the deposition of said top electrode material, of said bottom electrode material, of said solid body electrolyte material, of said reactive metal, of said ion donor material, and/or of said selection diode material is respectively performed by planar deposition of at least one layer of the corresponding material.

12. The method according to claim 7, wherein structuring or etching, respectively, of the layer stack is performed in two separate etching steps in that firstly said top electrode material and subsequently the top part of the layer stack is etched, wherein said top electrode material serves as a self-aligned mask.

13. The method according to claim 7, wherein structuring or etching, respectively, of the layer stack is performed through all material layers down to said bottom electrode material.

14. The method according to claim 7, wherein structuring or etching, respectively, of the layer stack is performed with an anisotropic etching method.

15. The method according to claim 7, wherein, after structuring or etching, respectively, of the layer stack, trenches etched therein are filled with a dielectric and are subsequently planarized.

16. The method according to claim 7, wherein structuring or etching, respectively, of the layer stack is performed either selectively to the insulating material, so that holes are etched, or non-selectively, so that trenches are etched.

17. The method according to claim 7, wherein, by generating of the bottom electrode paths, bit lines of the memory array, and by generating of the top electrode paths, word lines of the memory array are formed, or, vice versa, by generating of the bottom electrode paths, word lines of the memory array, and by generating of the top electrode paths, bit lines of the memory array are formed.

18. The method according to claim 7, wherein electrochemically active chalcogenide material, preferably of germanium, selenium, sulfur and/or silver is used as solid body electrolyte material or as ion donor material, respectively.

19. The method according to claim 7, wherein metal is preferably used as top electrode material.

20. The method according to claim 7, wherein silver or copper is used as reactive metal.

21. A system with a memory device comprising at least one solid body electrolyte memory cell manufactured in accordance with claim 1.

* * * * *